US008654226B2

(12) United States Patent
Decker

(10) Patent No.: US 8,654,226 B2
(45) Date of Patent: Feb. 18, 2014

(54) CLOCK GATED POWER SAVING SHIFT REGISTER

(75) Inventor: Steven Decker, Sandown, NH (US)

(73) Assignee: Analog Devices, Inc., Norwood, MA (US)

( * ) Notice: Subject to any disclaimer, the term of this patent is extended or adjusted under 35 U.S.C. 154(b) by 310 days.

(21) Appl. No.: 13/049,018

(22) Filed: Mar. 16, 2011

(65) Prior Publication Data
US 2012/0235020 A1    Sep. 20, 2012

(51) Int. Cl.
H04N 3/14      (2006.01)
H04N 5/335     (2011.01)
G11C 19/00     (2006.01)

(52) U.S. Cl.
USPC .............. 348/294; 348/308; 377/64; 377/70; 377/75; 377/77

(58) Field of Classification Search
USPC ........ 348/294, 302, 307, 308; 377/64, 72, 73, 377/74, 77, 81
See application file for complete search history.

(56) References Cited

U.S. PATENT DOCUMENTS

| | | | | |
|---|---|---|---|---|
| 4,574,357 A | * | 3/1986 | Pastor et al. | 382/258 |
| 4,858,020 A | * | 8/1989 | Homma | 358/451 |
| 5,229,657 A | * | 7/1993 | Rackley | 326/26 |
| 5,289,518 A | * | 2/1994 | Nakao | 377/81 |
| 5,453,710 A | | 9/1995 | Gilbert et al. | |
| 5,724,046 A | * | 3/1998 | Martin et al. | 342/357.69 |
| 5,926,201 A | * | 7/1999 | Fleming et al. | 347/237 |
| 6,101,609 A | * | 8/2000 | Kawasaka | 713/322 |
| 6,989,695 B2 | * | 1/2006 | Dike et al. | 327/142 |
| 7,242,427 B2 | * | 7/2007 | Kokubun et al. | 348/241 |
| 2004/0051795 A1 | | 3/2004 | Ajioka | |
| 2005/0044307 A1 | | 2/2005 | Regev et al. | |
| 2010/0052800 A1 | | 3/2010 | Buonpane et al. | |

OTHER PUBLICATIONS

NAND gate Wikipedia entry from Dec. 20 2009; http://en.wikipedia.org/wiki/NAND_gate accessed via Wayback Machine http://web.archive.org/web/20091220092633/http://en.wikipedia.org/wiki/NAND_gate on May 1 2013.*
PCT International Search Report for PCT/US12/024501 mailed on Jun. 7, 2012.

* cited by examiner

Primary Examiner — Daniel M Pasiewicz
(74) Attorney, Agent, or Firm — Kenyon & Kenyon, LLP

(57) ABSTRACT

A gated-clock shift register including a series of clocked flip-flops with preceding outputs connected to subsequent inputs as a horizontal digital shift register. Each flip-flop (or other state holding device) includes a clock buffer between the respective flip-flop's clock, and the global clock. Each clock buffer propagates the clock signal when it determines the associated flip-flop will have a state change during that clock cycle (e.g., via an XOR of the flip-flops input and output signals). In the absence of a state change, that buffer does not propagate the clock signal, essentially only clocking the relevant flip-flops. Further, the clock buffer may be implemented with only NMOS devices (or alternatively, only PMOS devices), which offers power savings over an otherwise required CMOS implementation.

21 Claims, 7 Drawing Sheets

CLOCK GATED POWER SAVING SHIFT REGISTER

BACKGROUND

A typical digital shift register (DSR) consists of a chain of D-type flip-flops, one for each bit, in which the Q output of each stage is connected to the D input of the following stage. When a clock signal is asserted, the flip-flops each hold a data value present on the D input on their Q outputs. The data value is held until the clock signal is asserted again, when the value on the Q output is replaced by whatever new data value is present on the D input. FIG. 1 illustrates an example of a typical digital shift register having N flip-flops 101.1 to 101.N. The flip-flop would typically have a static CMOS design which consumes minimal power during static operation, but consumes significant power when clocked due to internal transitions at each clock edge. Clocking Power consumption arises even when the data on the flip-flop's output does not change. Further, the shift register dissipates additional power due to the global clock buffer, which must charge and discharge the capacitance of the global clock bus 110.

The typical digital shift register may be used in a number of contexts for a number of applications. One example application may be a control signal for digital image processing. A digital image may comprise a matrix of N by M pixels, and an image capturing device may include a sensor array of N by M sensors. An example of this is described further below with regard to FIG. 3. In the example, the control signal may be used to scan the image or sensor array pixel by pixel (or sensor by sensor). In this context, the control signal may be a horizontal shift register, shifting a logical "1" on every clock cycle (or every N clock cycles in other contexts, such as the vertical shift register or vice versa). The sensor intersecting the active HSR flip-flop and VSR flip-flop may then be the one active sensor of the N by M array. In this application, the shift registers may each have only two flip-flops changing state values (e.g., the current active flip-flop going back to an inactive state, and the next flip-flop becoming active), while the remaining N−2 and M−2 flip-flops experience no state change. Despite the lack of a state change in these flip-flops, they still consume power on each clock pulse. Using as an example a high definition video frame of 1920 pixels by 1080 pixels, there are 3,000 flip-flops used to scan the 1920 by 1080 sensors, 99.87% of which consume power on each clock cycle without actually needing to change states.

Accordingly, there is a need in the art for a control mechanism for use in shift registers that conserves power that otherwise will be wasted when a flip-flop stage inputs data that has a same value as is already stored in the flip-flop.

DETAILED DESCRIPTION

Embodiments of the present invention achieve a very low dynamic power in a digital shift register by adding a clock gating block to each stage. The clock gating block may prevent digital activity in stages of a shift register that do not change state. Example embodiments of the gated-clock shift register may include a shift register, e.g., a plurality of connected state-holding elements (e.g., flip-flops) each having a data input, a data output, and a clock input. Example embodiments of the gated-clock shift register may include clock buffers, e.g., a plurality of clock buffering elements, each associated with a respective state-holding element. Each of these buffers may have a clock output connected to the clock input of its respective state-holding element and an input for a shared clock signal. Further, each buffer may be configured to output the shared clock signal only when the respective state-holding element changes states.

Other example embodiments may reduce power dissipation by adding a gated, resistively-loaded clock buffer in each stage. The gating may ensure that only stages that will change state on the next clock rising edge (e.g., the present value is logic '0' and the next value is logic '1,' or the present value is logic '1' and the next value is logic '0') allow the global clock to propagate to the flip-flop clock input. The resistive load may allow the global clock to drive only an NMOS transistor, rather than an inverter (e.g., one NMOS transistor and one PMOS transistor), which may reduce capacitance on the global clock bus. Since docking power may be proportional to gate area, and the minimum gate area may be set by process design rules, the gate area of a single minimum-size NMOS or PMOS may be less than the combined gate area of a minimum-size inverter, which may comprise a power savings in addition to saving the power that would otherwise be dissipated inside the flip-flop. In alternative embodiments a PMOS transistor may be used, instead of an inverter (e.g., both a NMOS transistor and a PMOS transistor configured as an inverter). For shift registers with hundreds or thousands of stages but only a few state transitions, the shift register described in the example embodiments of the present invention may have a much lower power than a typical shift register.

Figure 1:
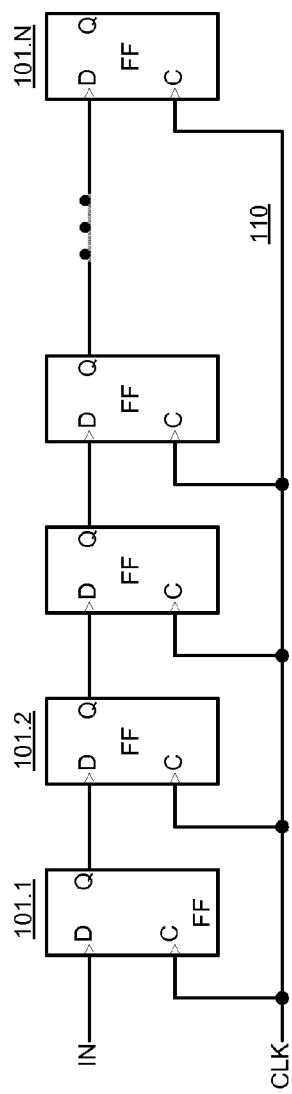
FIG. 1 illustrates an example digital shift register, according to one example embodiment of the present invention.
Figure 2:
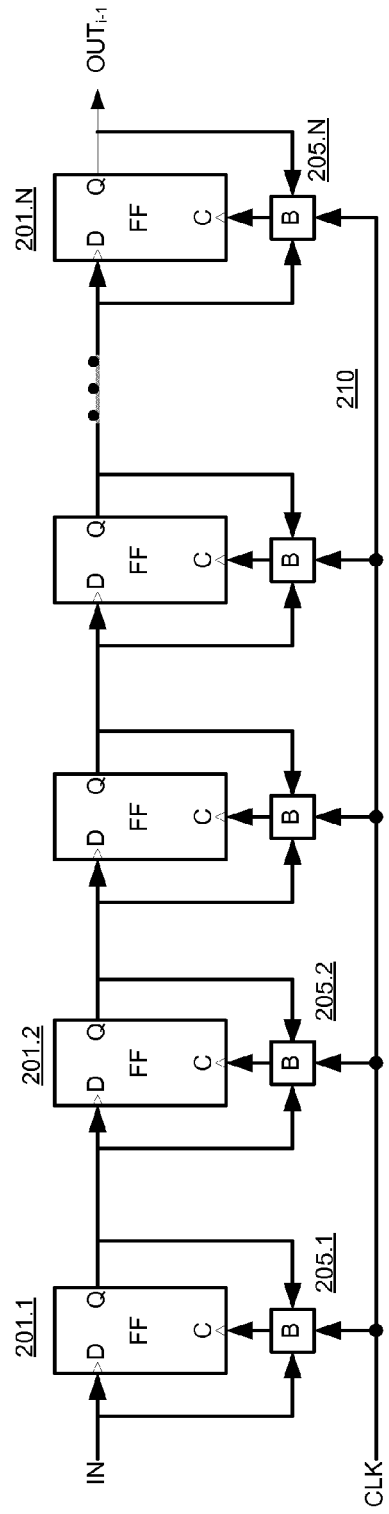
FIG. 2 illustrates an example clock-gated digital shift register, according to one example embodiment of the present invention.

FIG. 2 illustrates a digital shift register 200 according to an embodiment of the present invention. The shift register 200 may include a number of flip-flop stages 201.1-201.N and associated clock gating blocks 205.1-205.N. Each clock gating block 205.1, 205.2, . . . , 205.N may receive a common clock signal as an input and pass the clock signal along to its associated flip-flop if the clock gating block 205.1, 205.2, . . . , 205.N determines that the flip-flop's state will change. Otherwise, if the clock gating block 205.1, 205.2, . . . , 205.N determines that the associated flip-flop's state will not change in an upcoming clock cycle, the clock gating block 205.1, 205.2, . . . , 205.N may block the clock signal from being input to the flip-flop. In this manner, flip-flops 201.1, 201.2, . . . , 201.N that will not undergo a state transition within a given clock cycle are prevented from consuming power associated with clock edges.

The shift register 200 of FIG. 2 may be implemented as a circular shift register in which case the output of the final flip-flop 201.N may be input to the first flip-flop 201.1. Further, taps may be taken from the output of any flip-flop stage for use in other circuit systems, such as described below.

Figure 3:
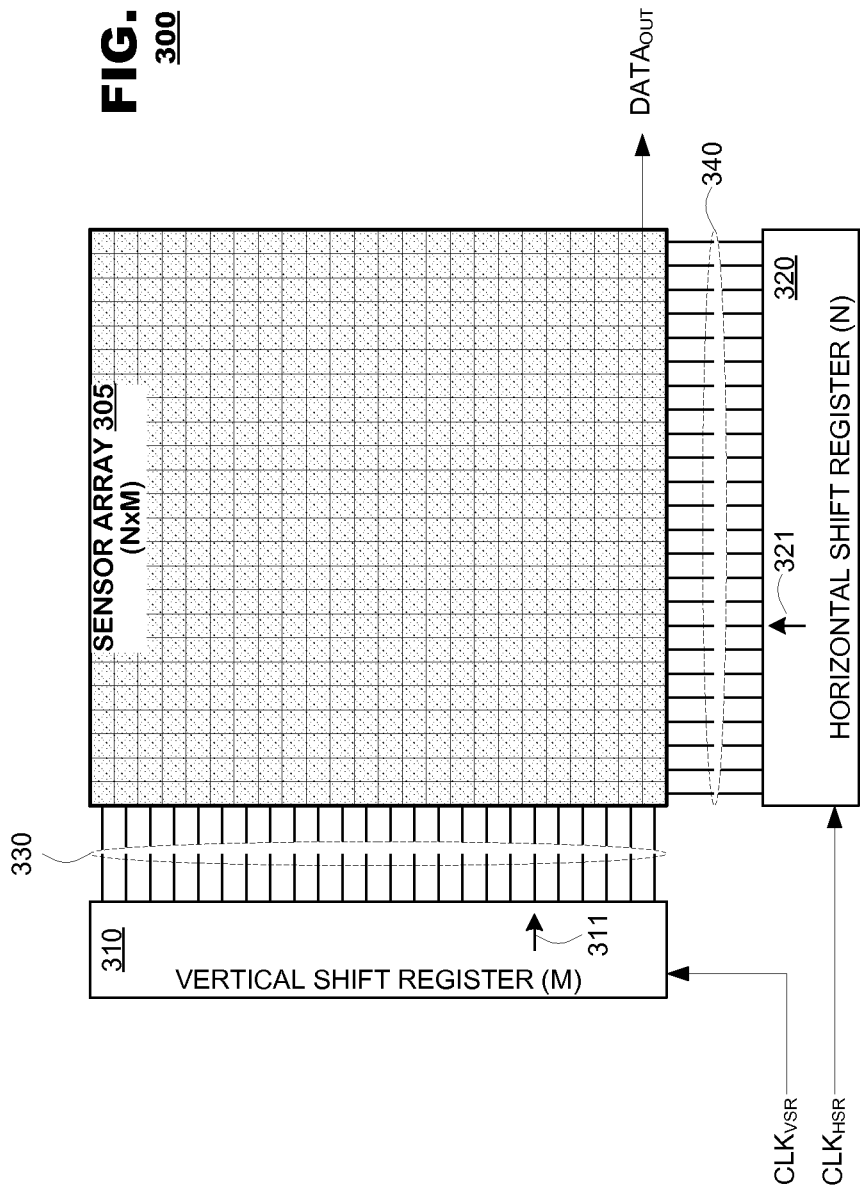
FIG. 3 illustrates an example sensor array with control signal DSRs, according to one example embodiment of the present invention.

FIG. 3 illustrates an exemplary image sensor 300 in which the present invention may find application. The image sensor 300 may include a sensor array 305 a vertical shift register 310 and a horizontal shift register 320. The sensor array 305 may include an array of image sensor elements (commonly, photodiodes) which convert incident light to computer-readable data, e.g., by converting voltage via an analog to digital converter circuit. The image elements may be accessed by addressing signals provided by the vertical shift register and horizontal shift register 320 over addressing lines 330 and 340. For an N×M array, the horizontal shift register 320 may include N flip-flops (not shown) and the vertical shift register may include M flip-flops (also not shown).

During operation, the vertical and horizontal shift registers 310, 320 each may store an access pointer 311, 321 (typically, a "1" value) in a single register position. The access pointers 311, 321 may be shifted throughout their respective shift registers 310, 320 during operation of the image sensor. Typically, one of the shift registers (say, the horizontal shift register 320) is shifted at a much higher rate than the other shift register (the vertical shift register 310). In that manner, the access pointer of the vertical shift register 310 may activate a given row of the array 305 via an associated address line 330 and hold the address line in an activated state for a time sufficient to allow the horizontal shift register to activate each of the N image elements and read data therefrom. The horizontal shift register 320 shifts its pointer 321 through all N register positions. Thereafter, the vertical shift register 310 advances its access pointer to the next row position and the horizontal shift register 320 again shifts its pointer 321 through all N register positions. This process repeats until the horizontal and vertical shift registers access all of the N×M image elements from the sensor array. In an image sensor having 3,000 rows and 4,000 columns, 3,000 shifts of the vertical shift register 310 and 12 million shifts of the horizontal shift register 320 would be required to read a single frame of data from the image sensor.

The shift register of FIG. 2 may find application in an image sensor such as shown in FIG. 3. In such an implementation, clock gating buffers may prevent propagation of a clock signal to all register positions except those that carry the access pointer. The clock gating buffers may allow the clock signal to be input to a flip-flop position into which the access pointer will be input—that flip-flop's output will transition from 0 to a 1. Additionally, the clock gating buffers may allow the clock signal to be input to a flip-flop position from which the access point previously was input—that flip-flop's output will transition from a 1 to a 0. The clock gating buffers may prevent the clock signal from being input to any other flip-flop positions in the shift register, which can be several thousand register positions.

Figure 4:
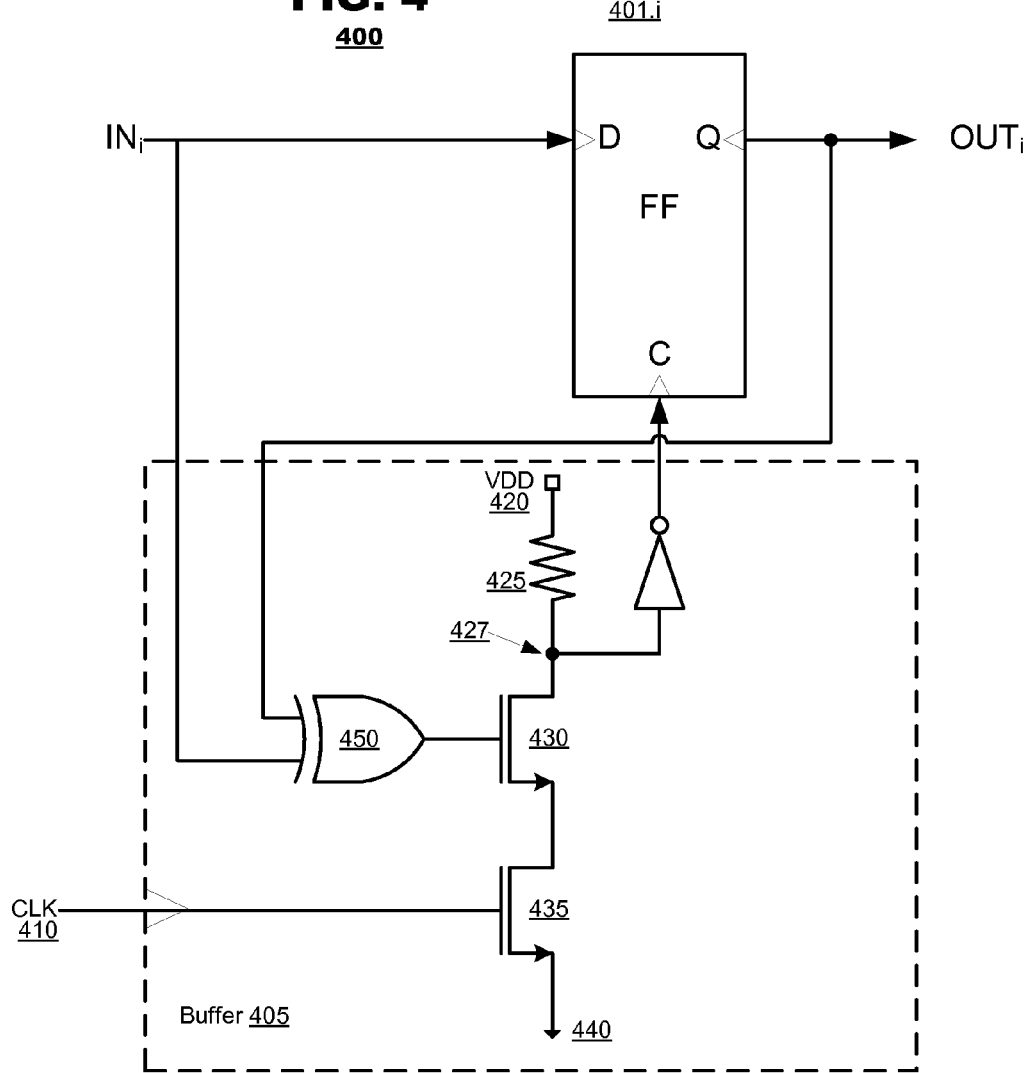
FIG. 4 illustrates one example clock buffer, according to one example embodiment of the present invention.

FIG. 4 illustrates an example embodiment of the stage clock buffer. The stage clock buffer 305 may be a series connection of a pull-up resistance 425 connected to the supply voltage 420, an NMOS pass transistor 430, and an NMOS pull-down transistor 435 connected to a common potential 440 (e.g., ground). This may form an NMOS-based NAND gate with the resistor 425, e.g., node 427 may have a high (e.g., logic 1) voltage signal, unless the signal at both transistors' gate inputs also have a high (e.g., logical 1) voltage signal. Thus, to effectuate the clock buffer design, global clock 410 may be connected to the gate of the pull-down NMOS transistor, and the gate of the NMOS pass transistor may be driven by an exclusive-OR of the flip-flop input and output. The node 427 between the pull-up resistance and the NMOS pass transistor may be inverted and then passed to the flip-flop clock input (e.g., converting the NAND to an AND function). This way, in stages for which the input and output are the same, the pass transistor is off, preventing any logic transition and static current. In stages for which the input and output are different, the global clock is buffered (e.g., blocked) by the stage clock buffer and inverter. In either case, the logic states are the same as they would be in the typical shift register (e.g., one without clock-buffers). While the buffered shift register has static power dissipation, it is fairly small compared to the achieved dynamic power savings achieved through the clock buffers.

FIG. 4 illustrates one example embodiment of the present invention, but other embodiments are also possible. For example, the buffers could be installed for subsets of the stages, e.g., a buffer for the first N flip-flops, a buffer for the second N flip-flops, etc. This arrangement may propagate the shared clock signal to any set of N flip-flops having an internal state change. Further, other example embodiments may use a different buffer architecture. For example, the global clock may drive a PMOS pull-up transistor and the resistive load may be a pull-down device, effectively flipping the buffer architecture illustrated in FIG. 4.

Figure 5:
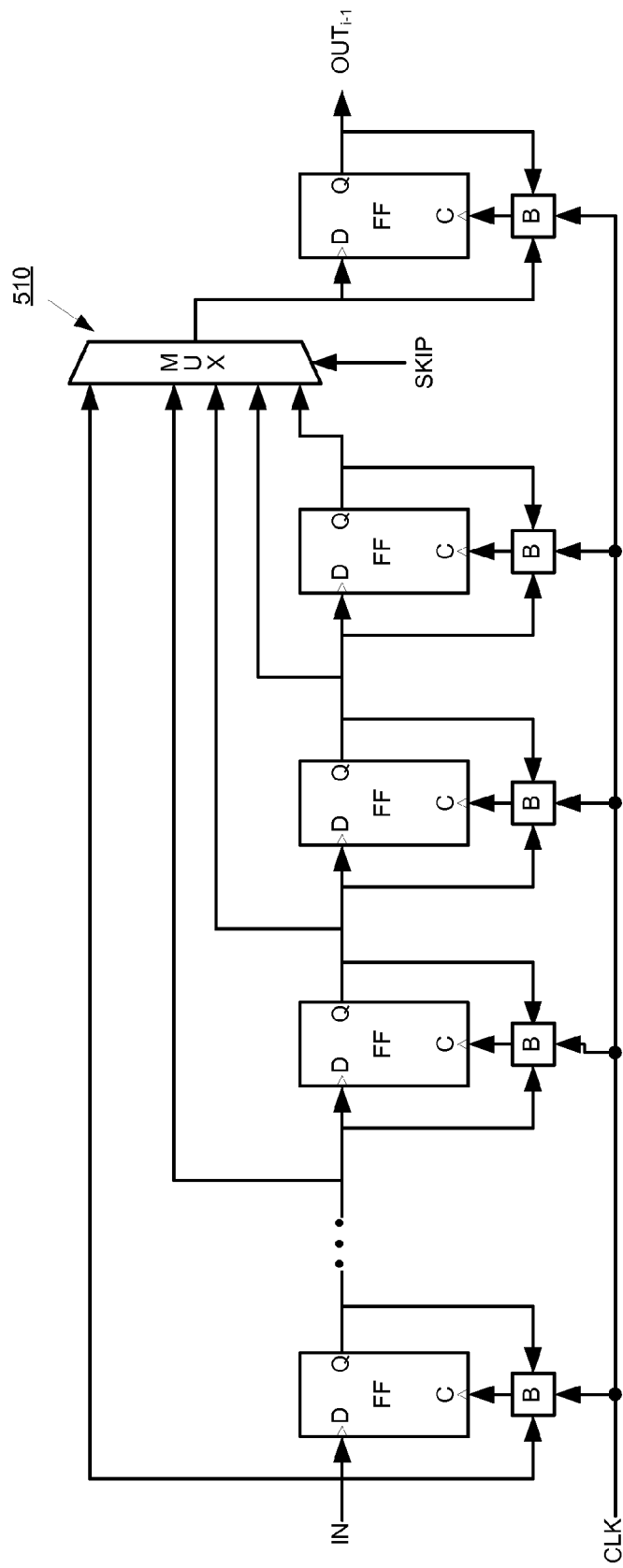
FIG. 5 illustrates one example clock-gated digital shift register with a skip-function MUX, according to one example embodiment of the present invention.

Some example embodiments of the present invention may include a skip mode. FIG. 5 illustrates one example embodiment of a digital shift register 500 with a skip-function MUX 510. For example, to provide an Nx skip function, each output of N stages (e.g., N flip-flops) may be connected to both the input of the subsequent stage and an input of an N:1 MUX 510. The N:1 MUX may have its output connected to the input of the stage immediately following the N stages. The MUX select lines may then be set to cause the proper output (e.g., depending on the magnitude of the desired skip) to bypass some number of stages (e.g., N−1), reducing the full scan HSR to an Nx skip HSR. Example embodiments implementing the power savings of gating the global clock to the shift register elements may be implemented with or without a skip function.

Figure 6:
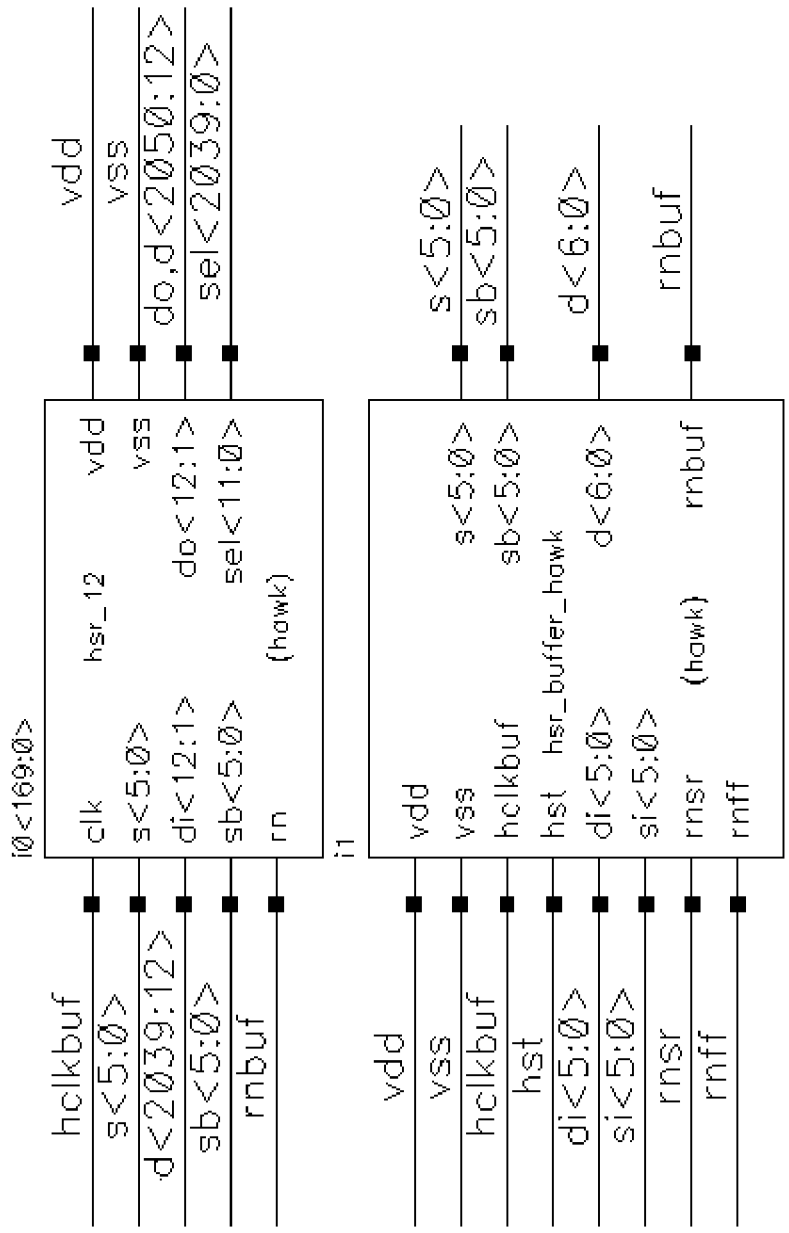
FIG. 6 illustrates a top-level horizontal shift register (HSR), according to another example embodiment of the present invention.

FIG. 6 is a top-level horizontal shift register (HSR) block diagram, according to another example embodiment of the present invention. In FIG. 6, the buffer latches and buffers si[5:0] and di[5:0] from the digital block set the skip mode and shift register inputs, respectively. The skip mode may allow the "1" in the shift register to jump over one or more stages in a single clock cycle. Bypassed stages may remain in the "0" state. This may be used to trade-off resolution for frame rate. An example implementation may have a limited selection of skip values "N" for practical reasons, but in other implementations N could be any positive integer. N could also change during the readout, which may be useful when only the center of the image needs to be read-out. The rnff and rnsr inputs may be low-active resets for the flip-flops in the buffer and shift-register. Other signals include hst, which starts horizontal scan, hclk which is the shift register clock, and sel [2039:0] which are the outputs. The do output (e.g., do<12:1>) may allow the shift register output to be directly monitored.

Figure 7:
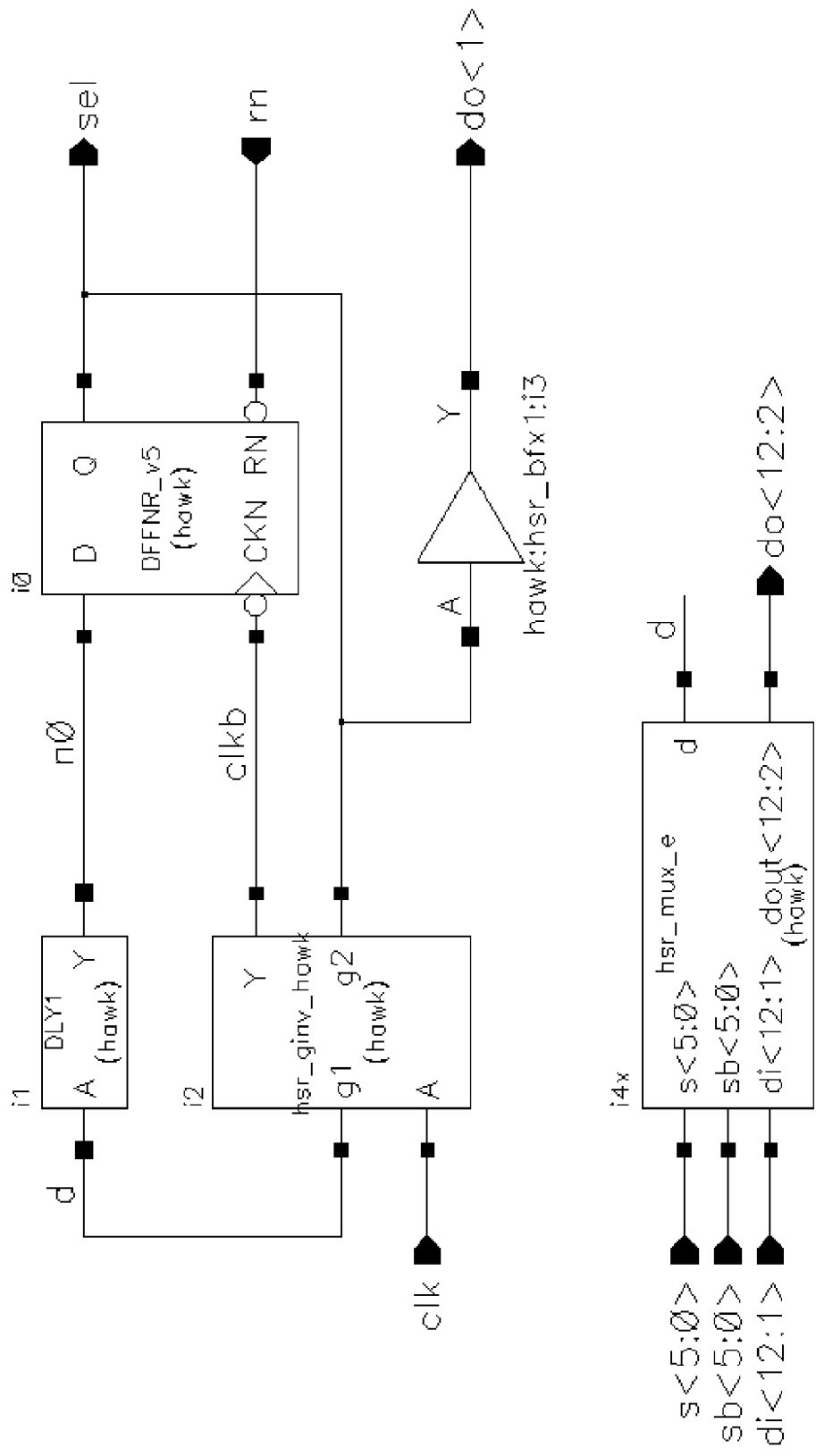
FIG. 7 illustrates one example stage, a plurality of which may form a shift register, according to another example embodiment of the present invention.

The shift register may be composed of several stages. FIG. 7 illustrates one example stage, a plurality of which may form the shift register. In one example embodiment, the outputs of preceding stages, e.g., di[12:1], are input to a 12-to-1 multiplexer, which may select the effective stage input, d, depending on the skipping mode. The effective input may be clocked in on the hclk rising edge, and the flip-flop output may go to a selected output and the following 12 stages. The multiplexers may be implemented as simple pass gates to save area, but any number of other configurations are possible.

Figure 8:
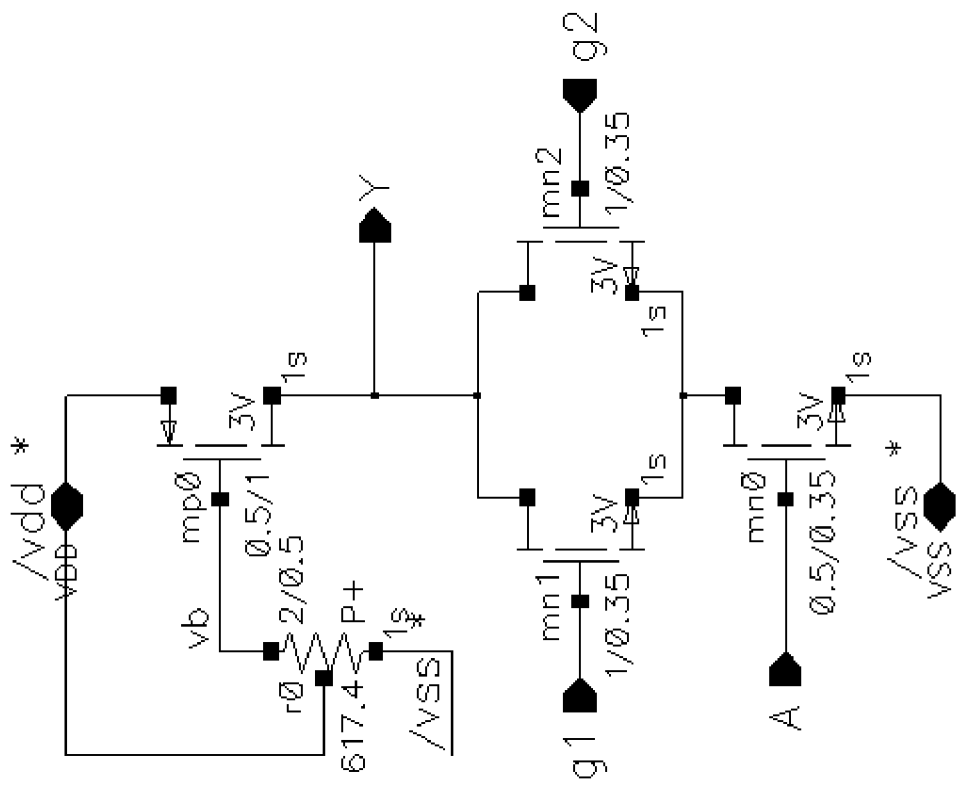
FIG. 8 illustrates an example embodiment of a generalized inverter cell as a gated inverter, according to another example embodiment of the present invention.

FIG. 8 illustrates an example embodiment of a gated inverter cell as a gated inverter. Rather than driving all of the flip-flop clock inputs directly, hclk may drive only mn0 in each stage, which may minimize the hclkbuf load. The gated inverter has gating control signals g1 and g2 that may be kept low except when the input or output is high, which may occur in at most four stages, e.g., a single shift register and a single "1" value may be implemented on two non-adjacent "1" bits in the HSR making four clocked stages. In all other stages, Y (e.g., an output connected to the flip-flop clock input) may stay high and the flip-flop may not be clocked (e.g., for a falling edge clocked flip-flop implementation), saving a significant amount of dynamic power. For example, a typical master-slave flip-flop may include eight transistors whose gates are driven by either the clock or its logic inverse. Power may be dissipated on every clock cycle to charge and discharge this capacitance regardless of the next or previous state of the FF. Since the flip-flops in those other stages do not need to be clocked, since its state would not change anyway, the power that would otherwise be dissipated in the transistors is conserved during those clock cycles.

Several embodiments of the invention are specifically illustrated and/or described herein. However, it will be appreciated that modifications and variations of the invention are covered by the above teachings and within the purview of the appended claims without departing from the spirit and intended scope of the invention.

I claim:

1. A gated-clock shift register, comprising:
a plurality of connected state-holding elements each having a data input, a data output, and a clock input;
a plurality of stage clock buffers, each associated with a respective state-holding element and having a clock output connected to the clock input of its respective state-holding element and an input for a shared clock signal, wherein each stage clock buffer is configured to output the shared clock signal only when the respective state-holding element changes states; and
a multiplexer (MUX) including a select line configured to cause a skip function in the gated-clock shift register by forwarding an output of a selected one of the state-holding elements to another one of the state-holding elements.

2. The gated-clock shift register of claim 1, wherein each stage clock buffer includes:
a pull-up resistance connected to a supply voltage;
a pass transistor connected to the resistance, wherein the at least one clock output is connected between the pass transistor and the resistance; and
a pull-down transistor connected to a common potential, wherein the shared clock signal is connected to a gate of the pull-down transistor.

3. The gated-clock shift register of claim 2, wherein a gate of the pass transistor is connected to an output of an exclusive-OR with inputs connected to the at least one data input and the at least one data output of the respective state-holding element.

4. The gated-clock shift register of claim 1, wherein each stage clock buffer uses only NMOS elements or only PMOS elements, but does not use both types of elements.

5. The gated-clock shift register of claim 1, wherein each stage clock buffer includes:
a pull-up transistor with a gate input connected to the shared clock signal;
a pull-down resistive load; and
a pass transistor connected between the pull-up transistor and the pull-down resistive load.

6. A gated-clock shift register, comprising:
a plurality of connected state-holding elements each having a data input, a data output, and a clock input;
a plurality of stage clock buffers, each associated with a respective state-holding element, having a clock output connected to the clock input of its respective state-holding element and inputs coupled respectively to the data input and data output of its respective state-holding element and to a global clock source; and
a multiplexer (MUX) including a select line configured to cause a skip function in the gated-clock shift register by forwarding an output of a selected one of the state-holding elements to another one of the state-holding elements.

7. The shift register of claim 6, wherein the clock buffers each comprise an exclusive OR gate having inputs coupled respectively to the data input and data output of its respective state-holding element, and an AND gate having inputs coupled to an output of the exclusive OR gate and to the global clock source.

8. The shift register of claim 7, wherein the clock buffers each include an output of the AND gate that is connected to the clock input of its respective state-holding element.

9. The shift register of claim 7, wherein the AND gate is constructed as an inverted NAND gate having only PMOS elements or only NMOS elements.

10. The shift register of claim 7, wherein the AND gate is constructed as:
a pull-up resistance connected to a supply voltage;
a pass transistor connected to the resistance;
an inverter connected between the pass transistor and the resistance; and
a pull-down transistor connected to a common potential, wherein the AND gate inputs are respectively connected to gate inputs of the pass transistor and the pull-down transistor, and wherein an output of the AND gate is connected to an output of the inverter.

11. An image sensor, comprising:
an array of image sensor elements provided in rows and columns;
a circular shift register, comprising:
a plurality of register positions connected in cascade, each register position associated with a respective row of the array and coupled, at an output thereof, to image sensor elements of its respective row by an associated access line, and
a plurality of stage clock buffers, each having an output connected to a clock input of a respective register position and inputs coupled respectively to an input of the register position and the output of the register position, and to a global clock source; and
a multiplexer (MUX) including a select line configured to cause a skip function in the circular shift register by forwarding an output of a selected one of the register positions to another one of the register positions.

12. The image sensor of claim 11, wherein the inputs of each stage clock buffer are combined in an exclusive-OR (XOR) function whose resulting output indicates a mismatch in the inputs of the respective register position, and wherein the XOR output is combined with the global clock source in an AND function whose resulting output drives the clock input of the respective register position.

13. The image sensor of claim 11, wherein the plurality of stage clock buffers use either only NMOS elements or only PMOS elements.

14. The image sensor of claim 11, further comprising:
a second circular shift register, comprising:
   a second plurality of register positions connected in cascade, each register position associated with a respective column of the array and coupled, at an output thereof, to image sensor elements of its respective column by an associated access line; and
   a second plurality of stage clock buffers, each having an output connected to a clock input of a respective register position and inputs coupled respectively to an input of the register position and the output of the register position, and to a second global clock source.

15. The image sensor of claim 14, wherein the second global clock source has a frequency equal or substantially similar to the inverse of the global clock source frequency.

16. The gated-clock shift register of claim 1, wherein the MUX includes N inputs connected to the respective data outputs of N of the plurality of connected state-holding elements, and an output connected to the data input of one of the plurality of connected state-holding elements located subsequent to the N state-holding elements.

17. The shift register of claim 6, wherein the MUX includes N inputs connected to the respective data outputs of N of the plurality of connected state-holding elements, and an output connected to the data input of one of the plurality of connected state-holding elements located subsequent to the N state-holding elements.

18. The image sensor of claim 11, wherein the MUX includes a plurality of inputs connected to the respective outputs of the plurality of register positions, and an output connected to an input of an additional register position located subsequent to the plurality of register positions.

19. A gated-clock shift register, comprising:
a plurality of connected state-holding elements each having a data input, a data output, and a clock input;
a plurality of stage clock buffers, each associated with a respective state-holding element and having a clock output connected to the clock input of its respective state-holding element and an input for a shared clock signal, wherein each stage clock buffer is configured to output the shared clock signal only when the respective state-holding element changes states; and
a multiplexer (MUX) including N inputs connected to the respective data outputs of N of the plurality of connected state-holding elements, and an output connected to the data input of one of the plurality of connected state-holding elements located subsequent to the N state-holding elements.

20. A gated-clock shift register, comprising:
a plurality of connected state-holding elements each having a data input, a data output, and a clock input;
a plurality of stage clock buffers, each associated with a respective state-holding element, having a clock output connected to the clock input of its respective state-holding element and inputs coupled respectively to the data input and data output of its respective state-holding element and to a global clock source; and
a multiplexer (MUX) including N inputs connected to the respective data outputs of N of the plurality of connected state-holding elements, and an output connected to the data input of one of the plurality of connected state-holding elements located subsequent to the N state-holding elements.

21. An image sensor, comprising:
an array of image sensor elements provided in rows and columns;
a circular shift register, comprising:
   a plurality of register positions connected in cascade, each register position associated with a respective row of the array and coupled, at an output thereof, to image sensor elements of its respective row by an associated access line, and
   a plurality of stage clock buffers, each having an output connected to a clock input of a respective register position and inputs coupled respectively to an input of the register position and the output of the register position, and to a global clock source; and
a multiplexer (MUX) including a plurality of inputs connected to the respective outputs of the plurality of register positions, and an output connected to an input of an additional register position located subsequent to the plurality of register positions.

* * * * *